United States Patent
Yamada (12)

(10) Patent No.: US 6,278,630 B1
(45) Date of Patent: Aug. 21, 2001

(54) FERROELECTRIC MEMORY DEVICE WITH A HIGH-SPEED READ CIRCUIT

(75) Inventor: Junichi Yamada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/218,084

(22) Filed: Dec. 22, 1998

(30) Foreign Application Priority Data

Dec. 26, 1997 (JP) .................................................... 9-360074

(51) Int. Cl.⁷ .................................................... G11C 11/22
(52) U.S. Cl. ................ 365/145; 365/189.09; 365/189.04
(58) Field of Search ........................ 365/145, 189.09, 365/189.04, 210, 203, 196, 65, 149

(56) References Cited

U.S. PATENT DOCUMENTS

| | | | |
|---|---|---|---|
| 4,873,664 | * 10/1989 | Eaton, Jr. .............................. | 365/145 |
| 5,086,412 | 2/1992 | Jaffe et al. ............................ | 365/145 |
| 5,119,154 | * 6/1992 | Gnadinger ............................ | 357/23.6 |
| 5,262,982 | 11/1993 | Brassington et al. . | |
| 5,273,927 | * 12/1993 | Gnadinger ............................ | 437/52 |
| 5,600,587 | * 2/1997 | Koike ................................... | 365/145 |
| 5,694,353 | * 12/1997 | Koike ................................... | 365/145 |
| 5,805,495 | * 9/1998 | Kimura ................................. | 365/145 |
| 5,815,430 | * 9/1998 | Verhaeghe et al. ................... | 365/145 |
| 5,901,077 | * 5/1999 | Nishimura ............................ | 365/145 |
| 5,969,979 | * 10/1999 | Hirano .................................. | 365/145 |
| 5,991,188 | * 11/1999 | Chung et al. ......................... | 365/145 |

FOREIGN PATENT DOCUMENTS

| | | |
|---|---|---|
| 0 486 901 A2 | 5/1992 | (EP) . |
| 2-110893 | 4/1990 | (JP) . |
| 2-301093 | 12/1990 | (JP) . |
| 4-283489 | 10/1992 | (JP) . |
| 6-302193 | 10/1994 | (JP) . |
| 6-342597 | 12/1994 | (JP) . |
| 7-192476 | 7/1995 | (JP) . |
| 8-45279 | 2/1996 | (JP) . |
| 8-212771 | 8/1996 | (JP) . |
| 9-8247 | 1/1997 | (JP) . |
| 9-102195 | 4/1997 | (JP) . |
| 09245488 | 9/1997 | (JP) . |
| 92-10639 | 6/1992 | (KR) . |

* cited by examiner

Primary Examiner—David Nelms
Assistant Examiner—Thong Le
(74) Attorney, Agent, or Firm—Sughrue, Mion, Zinn, Macpeak & Seas, PLLC

(57) ABSTRACT

A ferroelectric memory device includes a plurality of sets of bit lines which are connected to differential sense amplifiers and to a plurality of memory cells. Each memory cell contains one ferroelectric capacitor and one transistor, with a first electrode of the ferroelectric capacitor being connected to a plate line and the second electrode of the ferroelectric capacitor being connected to the source of the transistor. The gate of the transistor is connected to a word line and the drain is connected to a bit line. The memory cells generate a reference voltage which is provided to the differential sense amplifiers as a reference voltage for comparison with an data stored in the memory cells.

30 Claims, 19 Drawing Sheets

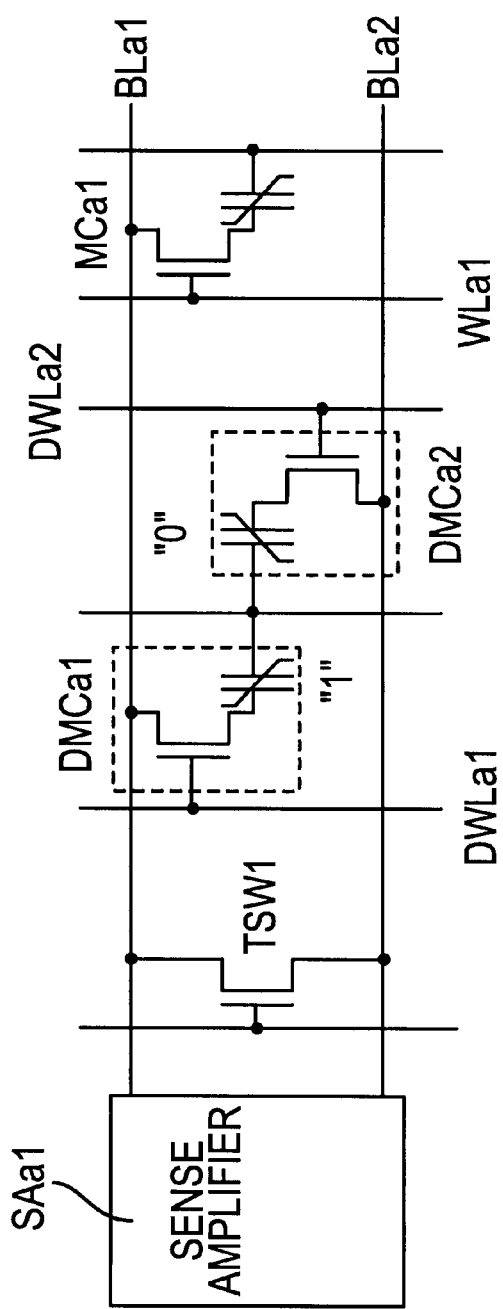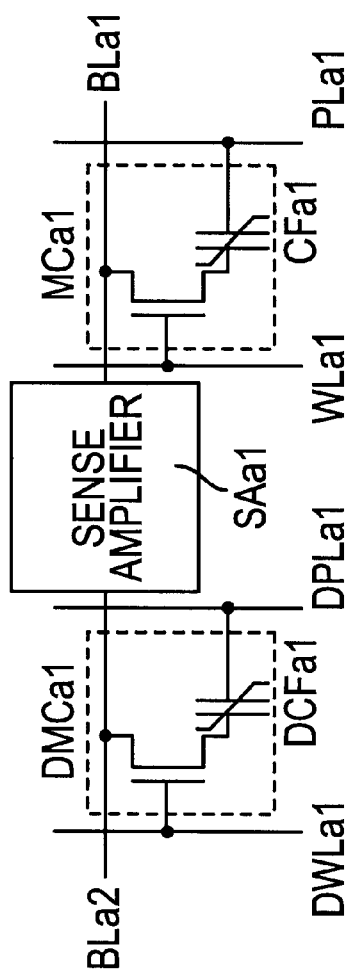
FIG. 1 (PRIOR ART)
FIG. 2 (PRIOR ART)

FERROELECTRIC MEMORY DEVICE WITH A HIGH-SPEED READ CIRCUIT

BACKGROUND OF THE INVENTION

1. Field of the Invention

The present invention relates to a nonvolatile semiconductor memory device, and more particularly to a ferroelectric memory device having a plurality of sets of bit lines, to which are connected a plurality of memory cells made up of one capacitor using a ferroelectric film and one MOS transistor, and differential sense amplifiers that can be connected to said bit lines. The ferroelectric memory device stores information by making the direction of polarization of the ferroelectric film correspond to binary information.

2. Description of the Related Art

In a ferroelectric memory device using a one-transistor one-capacitor type (1T1C type) memory cell, a reference voltage must be generated to determine whether data read from the memory cell is logic "0" or logic "1". One type of device employs a dummy cell. One example of such a dummy cell construction is disclosed in Japanese Patent Laid-open No. 192476/95 and Japanese Patent Laid-open No. 93978/95. In this method, dummy cells are prepared in which logic "1" and "0" are respectively written to two ferroelectric capacitors, data are read from both dummy cells, and the reference potential is generated by averaging their values.

The method disclosed in Japanese Patent Laid-open No. 93978/95 will be described with reference to FIG. 1. In the figure, logic "1" and "0" are written in dummy cells DMCa1 and DMCa2, respectively. After precharging bit lines BLa1 and BLa2, dummy cells DMCa1 and DMCa2 are selected by word lines DWLa1 and DWLa2, and signal potentials corresponding to "1" and "0" are generated on bit lines BLa1 and BLa2. Thereafter, transistor TSW1 is rendered conductive by a bit line short-circuit signal to generate a voltage on the bit line corresponding to the midpoint between "1" and "0". If a read from memory cell MCa1 takes place after rendering transistor TSW1 non-conductive and again precharging bit line BLa1, then bit line BLa1 becomes a potential corresponding to "1" or "0" read from memory cell MCa1 and bit line BLa2 becomes a potential corresponding to the midpoint between "1" and "0", thereby providing a one-transistor one-capacitor type ferroelectric memory device. Japanese Patent Laid-open No. 192476/95 discloses a construction in which the reference potential generated in a dummy cell is stored in an electronic memory unit to avoid subsequent generation of the reference potential. Thus, deterioration of the dummy cell due to film fatigue can be suppressed.

Other examples of dummy cell construction are disclosed in, for example, Japanese Patent Laid-open No. 301093/90 and U.S. Pat. No. 4,873,664 in which the size of the ferroelectric capacitor of dummy cells is made different from that of memory cells, in order to generate a reference potential.

The method disclosed in Japanese Patent Laid-open No. 301093/90 will be next described with reference to FIG. 2. In the figure, a signal potential is generated on bit line BLal by selecting memory cell MCa1 by means of word line WLa1 and by driving plate line PLa1. Dummy cell DMCa1 is selected by word line DWLa1, and a reference potential is generated on bit line BLa2 by driving plate line DPLa 1. The capacitor size in the dummy cell is made smaller than that of the memory cell, and moreover, the polarization direction is set such that polarization inversion always occurs when a reference potential is generated. In addition, CFa1 is selected such that its capacitance when polarization is not inverted is smaller than the capacitance of DCFa1 during polarization inversion. The capacitance of DCFa1 is therefore smaller than the capacitance of CFa1 during polarization inversion and greater than the capacitance when polarization is not inverted. A signal potential can thus be generated at BLa2 that corresponds to the midpoint between logic "1" and "0". Although the size of DCFa1 is made smaller than that of CFa1 in the above-described method, as disclosed in U.S. Pat. No. 4,873,664, the same effect can be obtained by both making DCFa1 bigger than that of CFa1 and by setting the direction of polarization such that polarization inversion never occurs when the reference potential is generated.

Another example of a dummy cell construction is described in Japanese Patent Laid-open No. 114741/93. In this example, a capacitor using a normal dielectric is employed as the capacitor of the dummy cell, and the accumulated charge of the dummy cell capacitor is used to boost the read-out signal potential such that the precharge potential is a potential corresponding to the midpoint between logic "1" and "0".

This method will be described is detail with reference to FIG. 3. In the figure, VCC/2 is supplied from the outside to one terminal of memory capacitor CFa1. Memory cell MCa1 is selected by word line WLa1, and the signal potential is generated on bit line BLa1. Dummy cell capacitor DCa1 is selected by dummy cell word line DWLa1, and boosts the potential of bit line BLa1. During a read operation, bit lines BLa1 and Bla2 are first precharged to VCC, following which word line WLa1 is selected and data are read into the bit lines. Dummy cell word line DWLa1 is then selected and the bit line potential is boosted. The capacitance used for the dummy cell at this time is such that the bit line potential when boosted is higher than the precharged potential when data is logic "1" and lower than the precharged potential when data is logic "0". As a result, the precharge potential of BLa2 is used as the reference potential, data can be sensed by sense amplifier SA.

In another method of generating a reference voltage, a reference voltage is generated in a memory cell without using a dummy cell. As an example, U.S. Pat. No. 5,086,412 discloses one such reference voltage self-generating system. According to this form, reads are carried out twice consecutively from the same memory cell, the charge read the second time being taken as the reference voltage. Explanation is presented using FIG. 4, FIG. 5, and FIG. 6 and citing the above-described U.S. Pat. No. 5,086,412. Memory cell MCa1 is selected by word line WLa1 after precharging bit line BLa1, and when plate line PLa1 is strobed (returning to the initial state after the plate line is strobed), a charge $\Delta Q1$ is read on bit line BLa1 by the transition from state A by way of state B to reach state C of FIG. 5 when the data is logic "1". When the data is logic "0", $\Delta Q0=0$ is read on bit line BLa1 because the transition is from state C to state B and then back to state C. The read charge is held in a sample & hold circuit by making TG1 "H". A second read is then carried out with respect to the same cell. Because memory cell MCa1 has been subjected to a destructive read, the second read charge is sure to be $\Delta Q0$, and the charge at the second read is therefore the reference. The charge read with TG2 at "H" is held in the sample & hold circuit and data are subsequently sensed by differential sense amplifier with TG3 as "H". In addition, bias capacitor CBIAS is added to the reference-side bit line BLR of the differential sense amplifier to enable a correct reading operation even in a case in which ΔQ0=0 for both the first and second read charges. The addition of this bias capacitor CBIAS has the effect of adding an offset between the two inputs of the differential sense amplifier by changing the impedance of the bit line, thereby enabling a 1-transistor 1-capacitor type ferroelectric memory device that does not require a dummy cell.

The hysteresis characteristic of the ferroelectric shown in FIG. 22 deteriorates with increase in retention time or with ferroelectric film fatigue depending on the number of times the memory cell is accessed. In other words, the hysteresis loop of the ferroelectric film of a memory cell in which the hysteresis loop is repeatedly reversed decreases due to fatigue. FIG. 23 shows the effect upon the read bit line voltage brought about by increase in the number of access times due to this fatigue effect. In other words, in "1" reads, which accompany polarization inversion, the read voltage decreases with increase in the number of read operations, but the read voltage is fixed and unaffected by the number of read operations for "0" reads, in which polarization inversion does not occur. In addition, the "1" and "0" read bit line voltage changes according to the number of times of access as shown in FIG. 24 and FIG. 25 in cases in which the deterioration of hysteresis is imprinted, i.e., when voltage of only one direction is applied to the ferroelectric. In other words, when the bit line capacitance CB is large, "1" and "0" read voltage decreases with increase in the number of read operations. When the bit line capacitance CB is small, the "1" read voltage increases with the number of times of access, and the "0" read voltage decreases with the number of times of access.

Furthermore, the read bit line voltage also changes with increase in the retention time of data as shown in FIG. 26, the read voltage decreasing with retention time for "1" reads that accompany polarization inversion, and the read voltage being fixed with no dependency on retention time during "0" reads.

With regard to the first of the methods in which the reference voltage is generated using dummy cells, i.e., a method in which data are read from two dummy cells in which "1" and "0" are respectively written, the values averaged, and the reference voltage generated as shown in FIG. 1, there is a problem that an accurate reference voltage cannot be generated due to the difference in frequency of access between memory cells and dummy cells over a great number of times of use. The same problem exists for Japanese Patent Laid-open No. 192476/95. The same problem also exists with regard to the second dummy cell method, i.e., the method shown in FIG. 2 in which the size of the dummy cell capacitor is made to differ from that of the memory cell capacitor and this difference then used to generate a reference voltage. Moreover, this problem cannot be avoided even in the third dummy cell method, i.e., the method shown in FIG. 3 in which a normal dielectric film is used in the dummy cell capacitor.

In addition, the difficulty of designing the dummy cell capacitor size can be raised as another problem in the second dummy cell method (FIG. 2). This problem arises because the dummy cell capacitor size is determined by estimating the capacitance during inversion and non-inversion of polarization of the dummy cell capacitor based on an advance estimate of the capacitance of the memory cell capacitor. This problem also exists for the third dummy cell method, i.e., the case in which a normal dielectric film is used in the dummy cell capacitor as shown in FIG. 3.

As yet another problem in the method of FIG. 4 in which reference voltage is generated within cells themselves without employing dummy cells, a precise reference voltage cannot be generated and the read margin of logic "1" becomes narrow. In concrete terms, the actual read charge for logic "1" is lower than ΔQ1 in FIG. 5, and the charge that contributes to the reference voltage is greater than ΔQ0, resulting in the problem that the read margin of logic "1" becomes narrow in the unaltered prior-art example. This problem occurs because the effect of bit line capacitance is not considered among the principles of read-out in the prior-art example shown in FIG. 5. The read operation of the prior art is next investigated again with proper consideration given to the bit line capacitance using FIG. 7. In the figure, the straight line represents the load line arising from the bit line capacitance. When logic "1" is read, ΔQ1 makes a transition on hysteresis from state A through B and actually reaching C, ΔQ1 becoming the charge that is read and thus becoming a value lower than ΔQ1 shown in FIG. 5. After reading of logic "1", moreover, the state makes a transition to C rather than to E as explained in the prior-art example, and the reference therefore becomes ΔQref1, which is greater than ΔQ0 in a subsequent reference read. As a result, in some cases ΔQ1≈ΔQref1, i.e., the charge at "1" reads and reference reads become nearly equal and the read margin narrows. In addition, a bias capacitor is provided in the prior-art method to correctly read logic "0", thus establishing an offset between ΔQ0 and ΔQref0. In states in which ΔQ1≈ΔQref1, however, this offset causes erroneous operation in which a "1" read is read as "0", and a correct read operation therefore cannot be expected in the prior-art method.

Yet another problem in the method shown in FIG. 4, in which the reference voltage is generated without using dummy cells, is slow access speed. This problem is caused by the large number of transitions of the plate line. In concrete terms, the plate line must make a transition from "L" to "H" and from "H" to "L" four times for a read of data from a memory cell and twice for rewriting in the prior-art example. The time constant is great because plate line wiring is generally long and a plurality of memory cells are connected. High-speed access therefore cannot be expected in the methods of the prior art.

SUMMARY OF THE INVENTION

It is an object of the present invention to provide a ferroelectric memory device having a highly reliable high-speed read circuit that solves the aforementioned problems relating to the method of generating a reference voltage that is necessary in a one-transistor one-capacitor type memory cell.

In the memory cell of the present invention, the first electrode of a capacitor using ferroelectric film is connected to a plate line, the second electrode is connected to the source of a MOS transistor, the gate of the MOS transistor is connected to the word line, and the drain is connected to the bit line. The memory cell includes means for self-generation of a reference voltage, and a sense amplifier senses memory cell data using the reference voltage self-generated by said memory cell as a standard.

According to the present invention, a precise voltage between logic "1" and "0" can always be generated as the reference voltage despite deterioration of the characteristics of the ferroelectric film and change in the read voltage, thereby eliminating the problem of inaccuracies in the reference voltage arising from variations that arise from fatigue of the ferroelectric film characteristic, imprint, or retention time.

Furthermore, logic "0" is written immediately prior to reading of the reference voltage, and a precise reference voltage can therefore always be generated and the read margin can always be maximized.

In addition, the number of times that the plate line voltage makes a transition from "L" to "H" or from "H" to "L" can be reduced from six to four as compared to the examples of the prior art, thereby allowing faster operation than in examples of the prior art.

Finally, the present invention eliminates the difficulties of designing dummy cell capacitor size because dummy cells are not necessary.

The above and other objects, features, and advantages of the present invention will become apparent from the following description based on the accompanying drawings which illustrate examples of preferred embodiments of the present invention.

BRIEF DESCRIPTION OF THE DRAWINGS

FIG. 1 is a circuit diagram of the prior art disclosed in Japanese Patent Laid-open No. 93978/95;

FIG. 2 is a circuit diagram of the prior art disclosed in Japanese Patent Laid-open No. 301093/90;

DETAILED DESCRIPTION OF THE PREFERRED EMBODIMENTS

Figure 3:
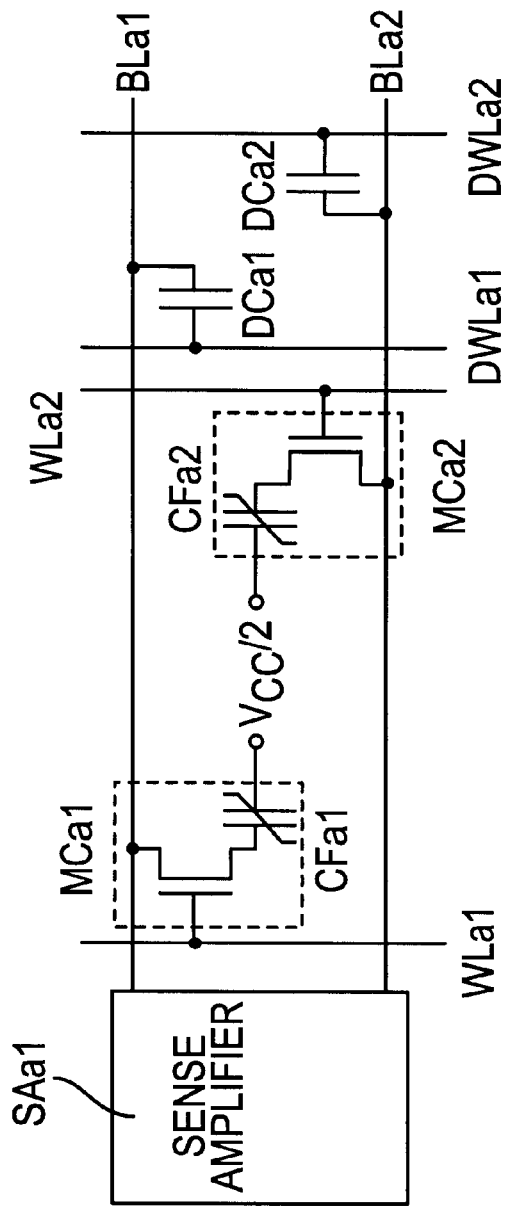
FIG. 3 is a circuit diagram of the prior art disclosed in Japanese Patent Laid-open No. 114741/93.
Figure 4:
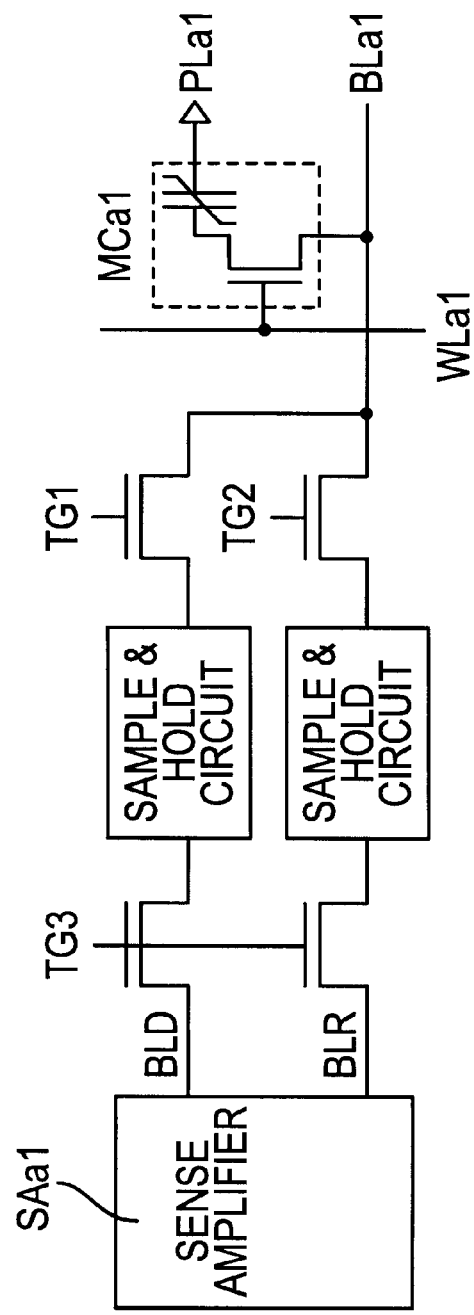
FIG. 4 is a circuit diagram of the prior art disclosed in U.S. Pat. No. 5,086,412.
Figure 5:
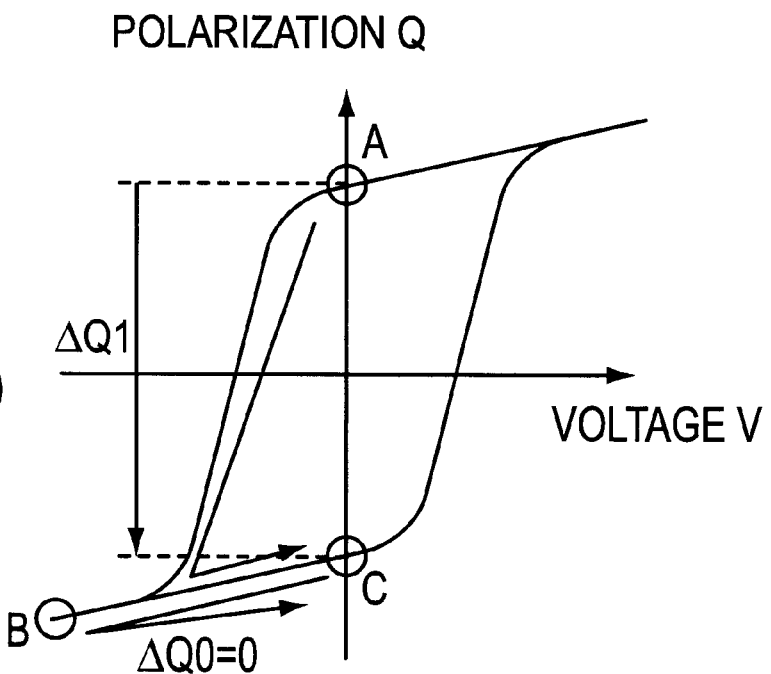
FIG. 5 is a graph for explaining the method of generating reference voltage of FIG. 4.
Figure 6:
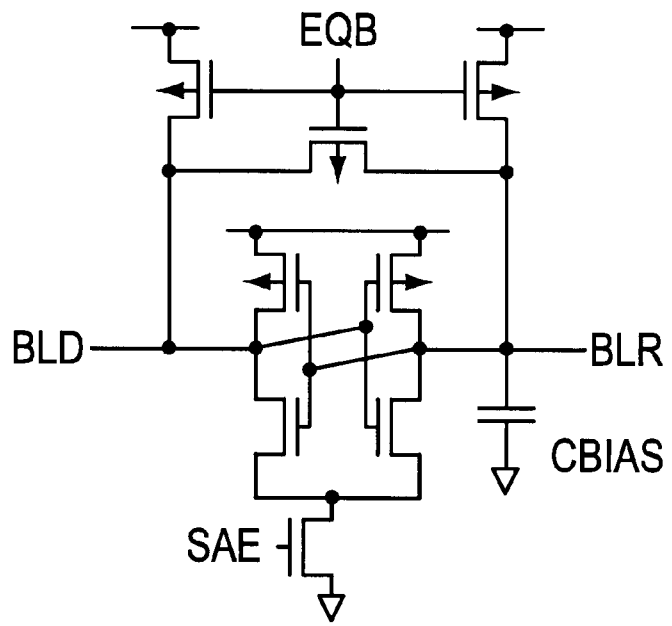
FIG. 6 is a circuit diagram of the sense amplifier used in FIG. 4.
Figure 7:
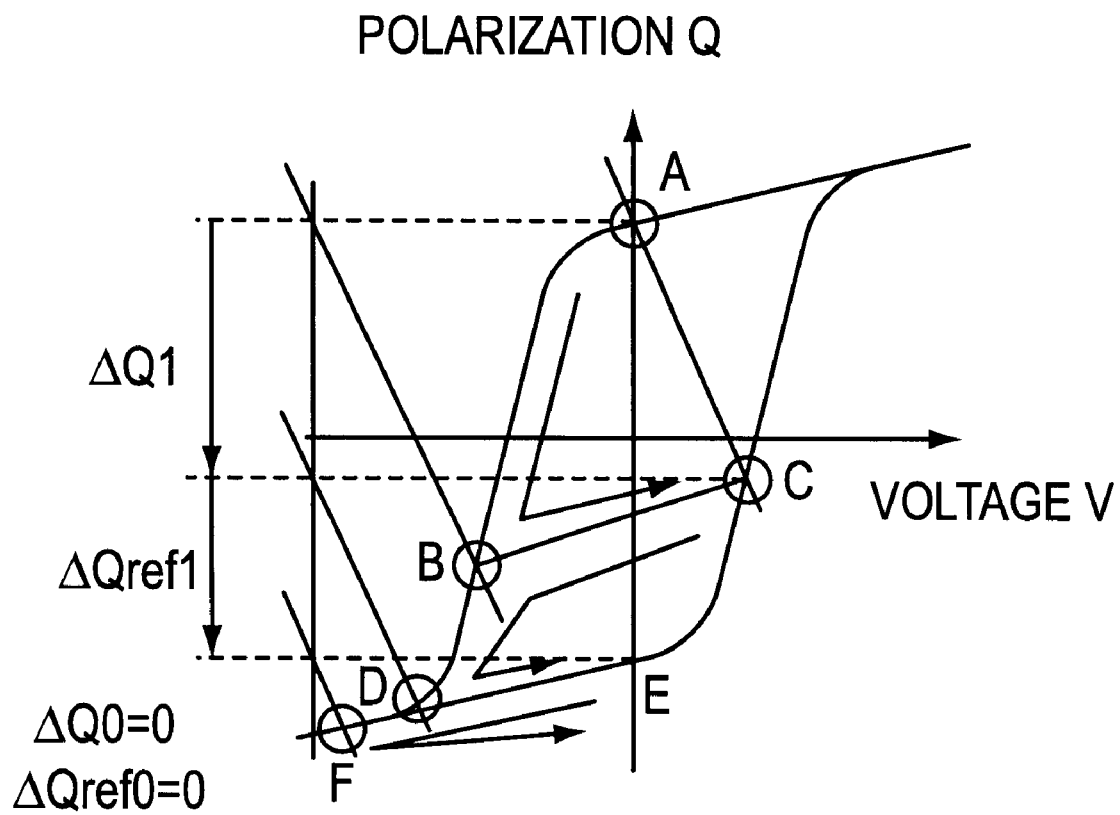
FIG. 7 is a graph for explaining the method of generating reference voltage of FIG. 4.
Figure 8:
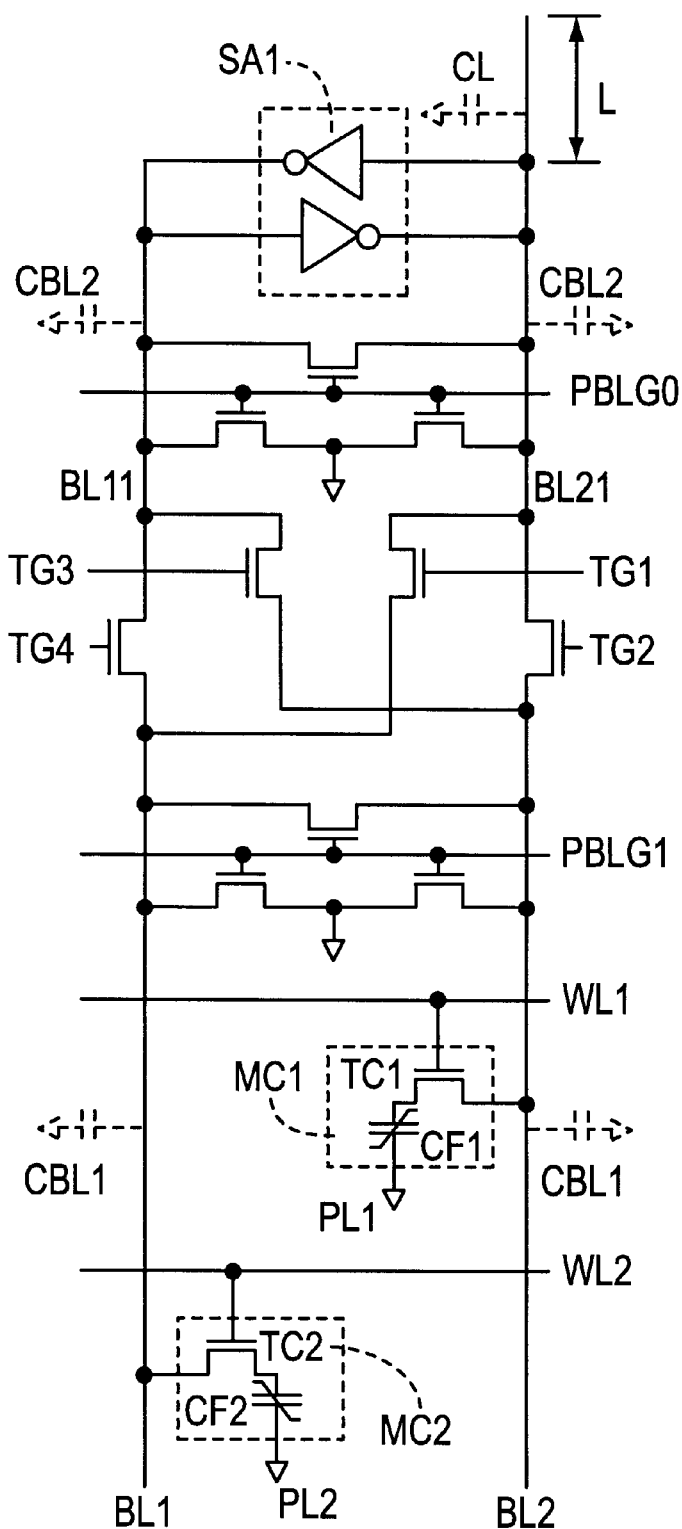
FIG. 8 is a circuit diagram of the ferroelectric memory device according to the first embodiment of the present invention.
Figure 9:
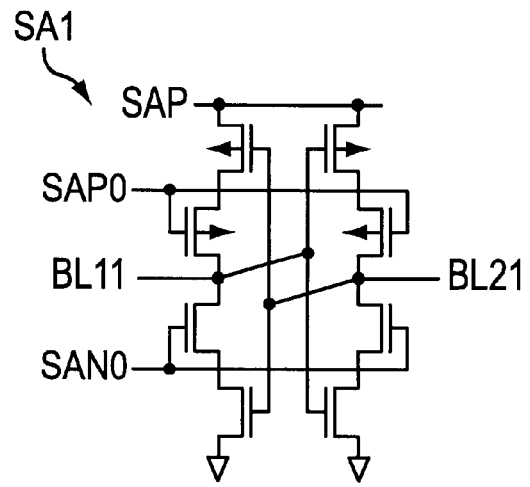
FIG. 9 is a circuit diagram of the sense amplifier used in the ferroelectric memory device of FIG. 8.

Referring now to FIG. 8, there is shown a ferroelectric memory device according to the first embodiment of the present invention.

Bit lines BL11 and BL21 and sense amplifier SA1 that amplifies the potential difference of both bit lines and senses data are connected at one end of two adjacent bit lines BL1 and BL2 by way of four MOS transistors controlled by signals TG1, TG2, TG3, and TG4. Bit line BL21 connected to sense amplifier SA1 is longer than bit line BL11 by an amount L. Bit lines BL1 and BL2 are precharged to the ground potential by bit line precharge signal PBLG1, and bit lines BL11 and BL21 are precharged to the ground potential by bit line precharge signal PBLG0.

Memory cell MC1 is made up of ferroelectric capacitor CF1 and cell transistor TC1. One terminal of ferroelectric capacitor CF1 is connected to plate line PL1, and the other terminal is connected to either the source terminal or drain terminal of cell transistor TC1. The other source or drain terminal of cell transistor TC1 is connected to bit line BL2, and the gate terminal is connected to word line WL1. The other memory cell MC2 is of the same circuit configuration, and its construction and element size are also the same.

Sense amplifier SA1 is a normal latch-type sense amplifier with MOS transistors controlled by signals SAPO and SAN0 to prevent leakage of read charges to bit lines BL1 and BL2 when inactive.

Figure 10:
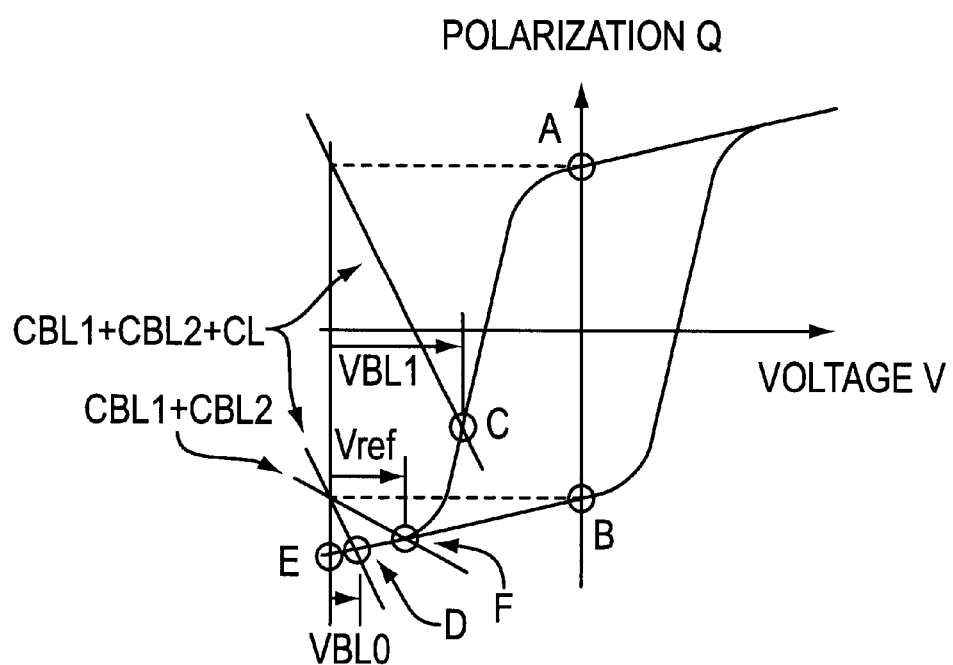
FIG. 10 is a graph for explaining the operation of the first embodiment.
Figure 11:
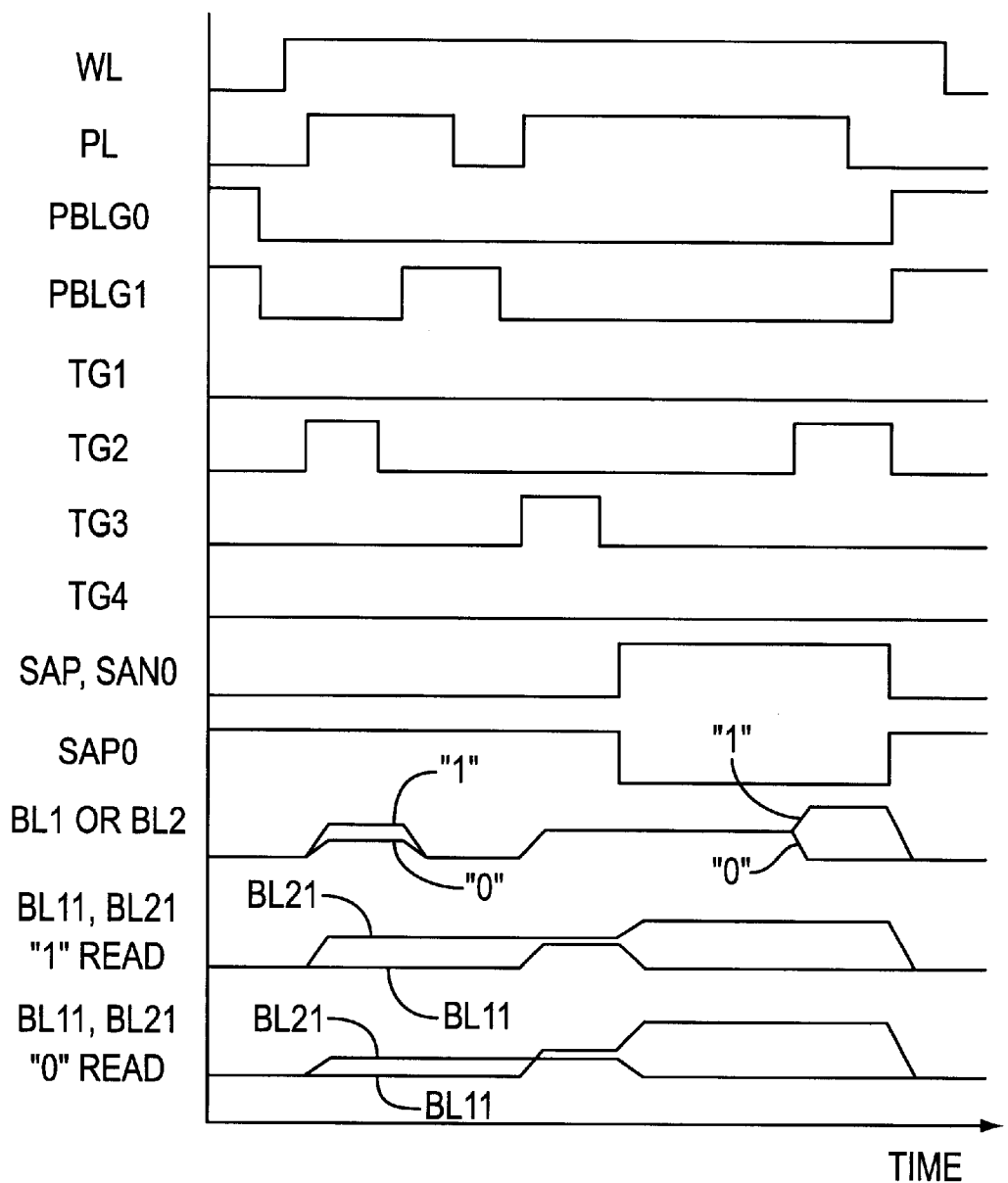
FIG. 11 is a timing chart showing the operation of the first embodiment.

The read operation of the circuit of FIG. 8 will be next explained with reference to FIGS. 10 and 11. Bit lines BL1, BL2, BL11, and BL21 are first precharged to the ground potential by making bit line precharge signals PBLG0 and PBLG1 the "H" level. Next, data is read to bit lines BL2 and BL21 by making word line WL1 "H" to select memory cell MC1, making plate line PL1 "H" and holding, and making signal TG2 "H". When the data read from memory cell MC1 is "1", memory cell MC1 transitions from state A to state C, and the bit line voltage becomes VBL1. When the data is logic "0", memory cell MC1 transitions from state B to state D and the bit line voltage becomes VBL0. Next, signal TG2 is made "L" and bit line precharge signal PBLG1 is made "H" to again precharge bit lines BL1 and BL2 to the ground potential. At this time, "0" is written to memory cell MC1 because plate line PL1 remains unchanged at "H". Memory cell MC1 hereupon transitions to state E, following which plate line PL1 is made "L", bit line precharge signal PBLG1 is made "L", to make the memory cell transition to state B.

Next, plate line PL1 is made "H", signal TG3 is made "H", to read the reference voltage from memory cell MC1 to bit lines BL2 and BL11. The capacitance of bit line BL11, however, is lower than that of bit line BL21 by an amount CL, and memory cell MC1 transitions from state B to state F and becomes bit line voltage Vref. Signal TG3 is then made "L".

Sense amplifier SA1 is then activated to sense data by making signals SAP and SAN0 "H" and making signal SAP0 "L". Reference voltage Vref is held in bit line BL11 and voltage VBL1 or VBL0 corresponding to logic "1" or "0" is held in bit line BL21, whereby a difference between the voltage which is either VBL1 or VBL0 and the reference voltage $V_{ref}$ is correctly amplified by sense amplifier SA1 and to thereby correctly sense the data.

Data is next rewritten to memory cell MC1 by making signal TG2 "H" and plate line PL1 "L", following which sense amplifier SA1 is deactivated by making signals SAP and SAN0 "L" and making signal SAP0 "H". Bit line precharge signals PBLG0 and PBLG1 are then made "H" to discharge the bit line, and word line WL1 is finally made "L" to complete the read operation. Regarding the load of bit line capacitance CL in this embodiment, the length of bit line BL21 may be made the same as bit line BL11 to add a capacitor having a capacitance of CL to bit line BL21.

Figure 12:
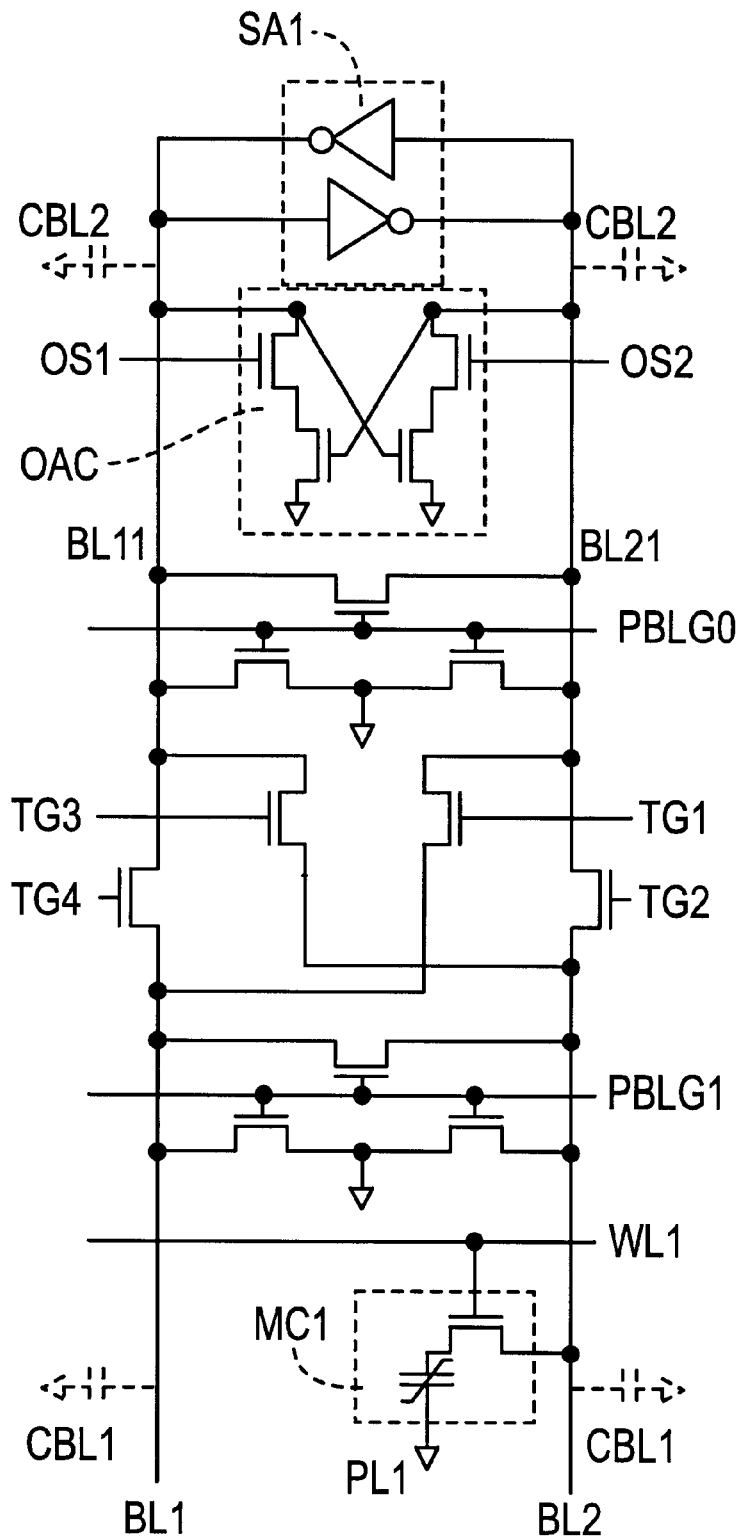
FIG. 12 is a circuit diagram of the ferroelectric memory device according to the second embodiment of the present invention.

FIG. 12 shows the second embodiment of the present invention. The constructions of memory cell MC1, sense amplifier SA1, and the four MOS transistors controlled by signals TG1, TG2, TG3, and TG4 are the same as in the first embodiment. However, an offset-adding circuit OAC made up of four NMOS transistors controlled by signals OS1 and OS2 is connected to bit lines BL11 and BL21 as a means of providing an offset between the data of the first read and the reference voltage of the second read.

Figure 13:
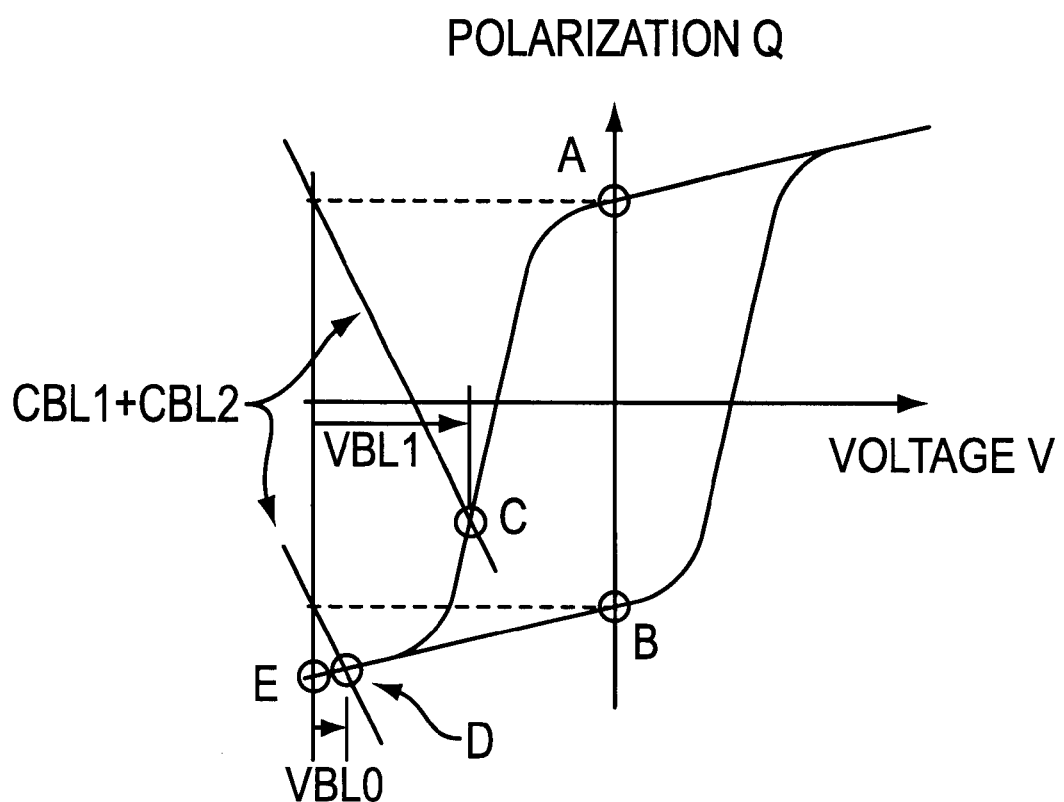
FIG. 13 is a graph for explaining the operation of the second embodiment.
Figure 14:
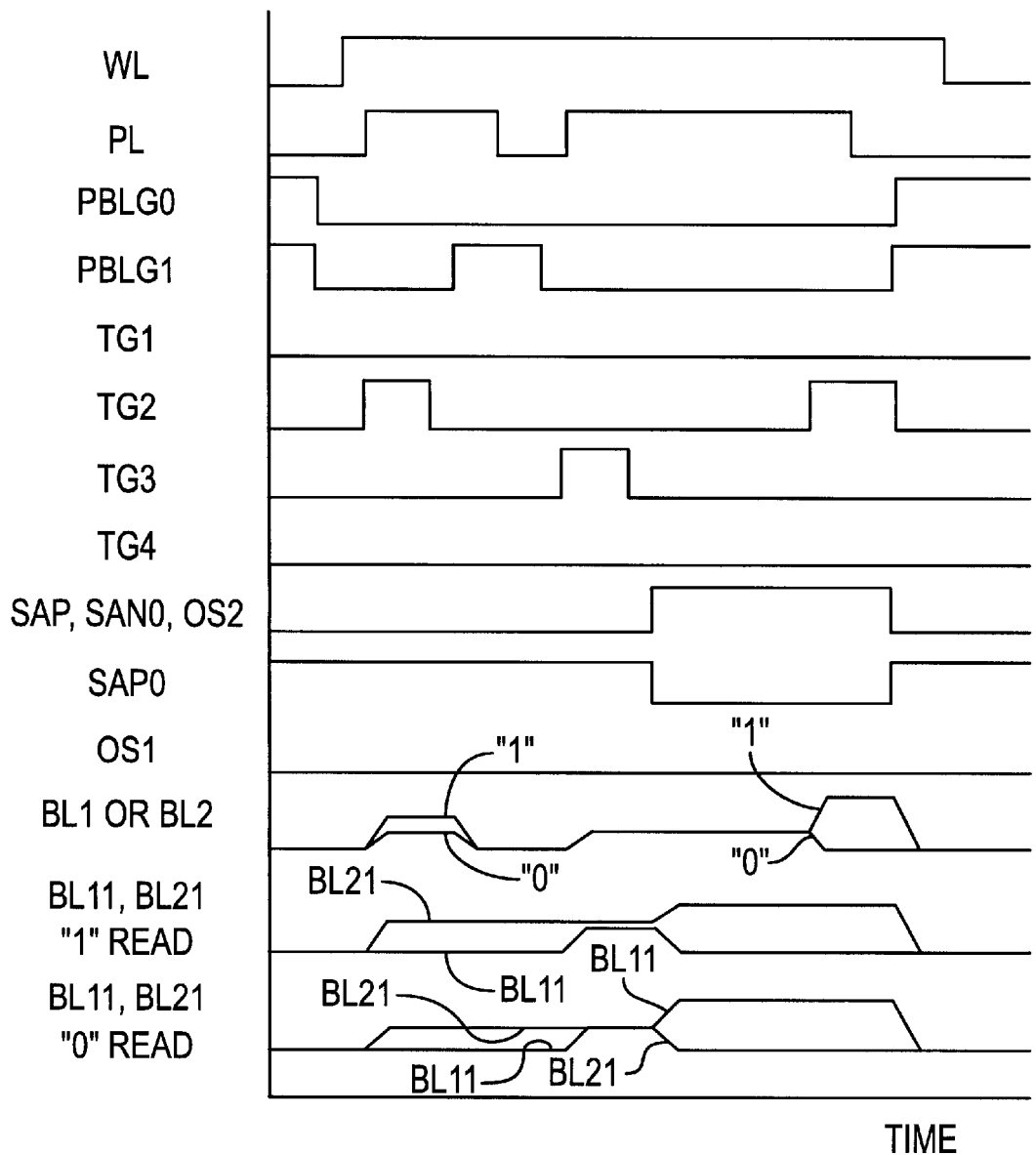
FIG. 14 is a timing chart showing the operation of the second embodiment.

The read operation of the circuit of FIG. 12 will be next explained with reference to FIGS. 13 and 14. Bit lines BL1, BL2, BL11, and BL21 are first precharged to the ground potential by making bit line precharge signals PBLGO and PBLG1 "H". Data is then read to bit lines BL2 and BL21 by making word line WL1 "H" to select memory cell MC1, making plate line PL1 "H", and making signal TG2 "H". When the data read from memory cell MCi is "1", memory cell MC1 transitions from state A to state C and the bit line voltage becomes VBL1. When the data is logic "0", memory cell MC1 transitions from state B to state D and the bit line voltage becomes VBL0. Next, bit lines BL1 and BL2 are again precharged by making signal TG2 "L" and bit line precharge signal PBLG1 "H". Logic "0" is then written to memory cell MC1 because plate line PL1 remains unchanged at "H". Memory cell MC1 then transitions to state E. After next making plate line PL1 "L", bit line precharge signal BLG1 is made "L" to make memory cell MC1 transition to state B.

Plate line PL1 is next made "H" and signal TG3 is made "H" to read the reference voltage from memory cell MC1 to bit lines BL2 and BL11. Memory cell MC1 then transitions from state B to state D, and the bit line voltage becomes VBL0. TG3 is then made "L".

Sense amplifier SA1 is next activated by making signals SAP, SAN0, and OS2 "H" and making signal SAP0 "L", to sense the data. At this time, VBL0 is held in bit line BL11 as the reference voltage and voltage VBL1 or VBL0 corresponding to logic "1" or "0" is held in bit line BL21. Changing OS2 to "H" is equivalent to increasing the size of W of the NMOS transistor on the bit line BL21 side of sense amplifier SA1, thereby enabling the establishment of an offset between the voltage of bit line BL11 and the voltage of bit line BL21, and sense amplifier SA1 can thus operate appropriately and correctly sense the data. The data are then rewritten as in the first embodiment to complete the read operation.

Figure 15:
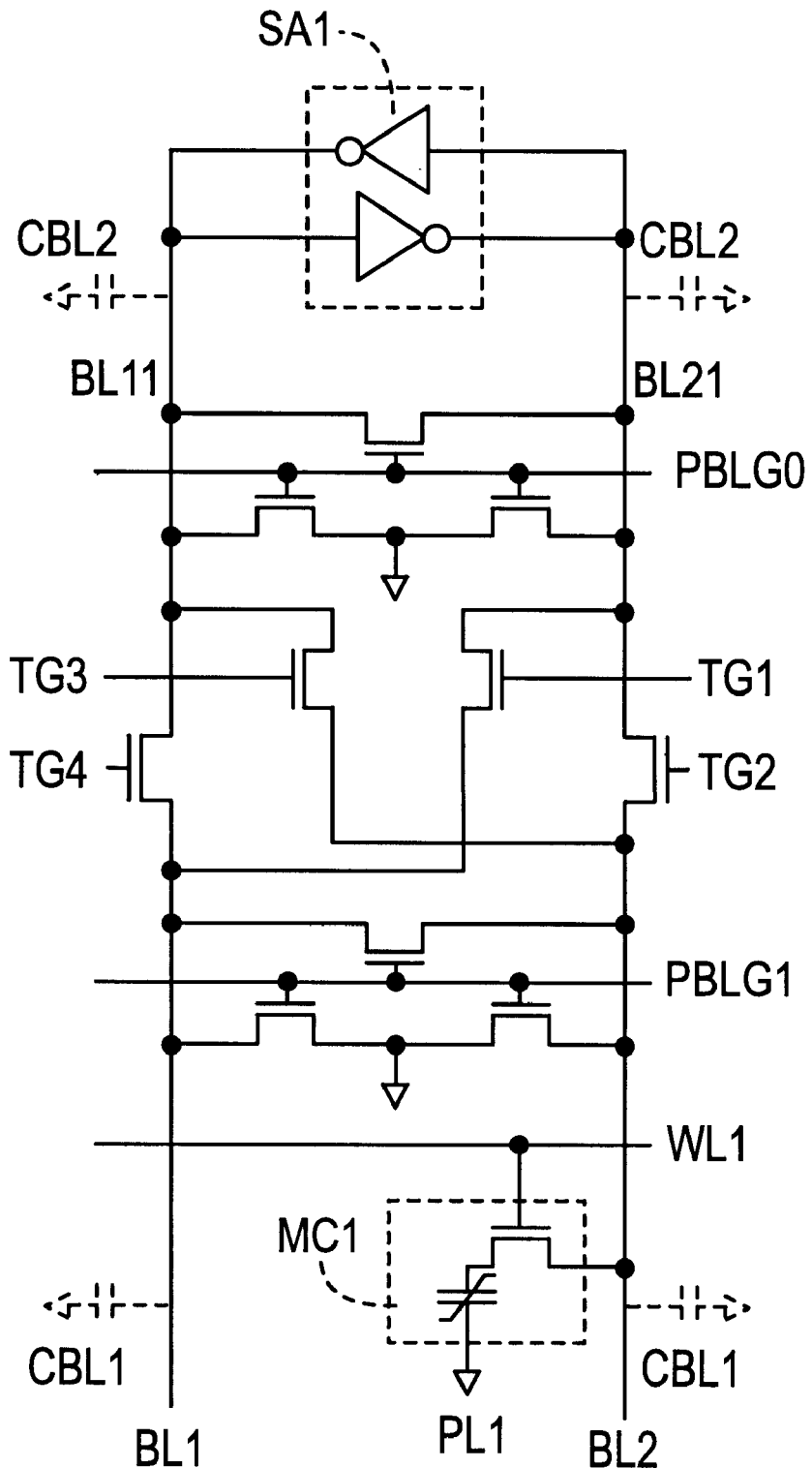
FIG. 15 is a circuit diagram of the ferroelectric memory device according to the third embodiment of the present invention.

FIG. 15 shows the third embodiment of the present invention. The constitutions of memory cell MC1, sense amplifier SA1, and the four MOS transistors controlled by signals TG1, TG2, TG3, and TG4 are equivalent to those of the first embodiment.

Figure 16:
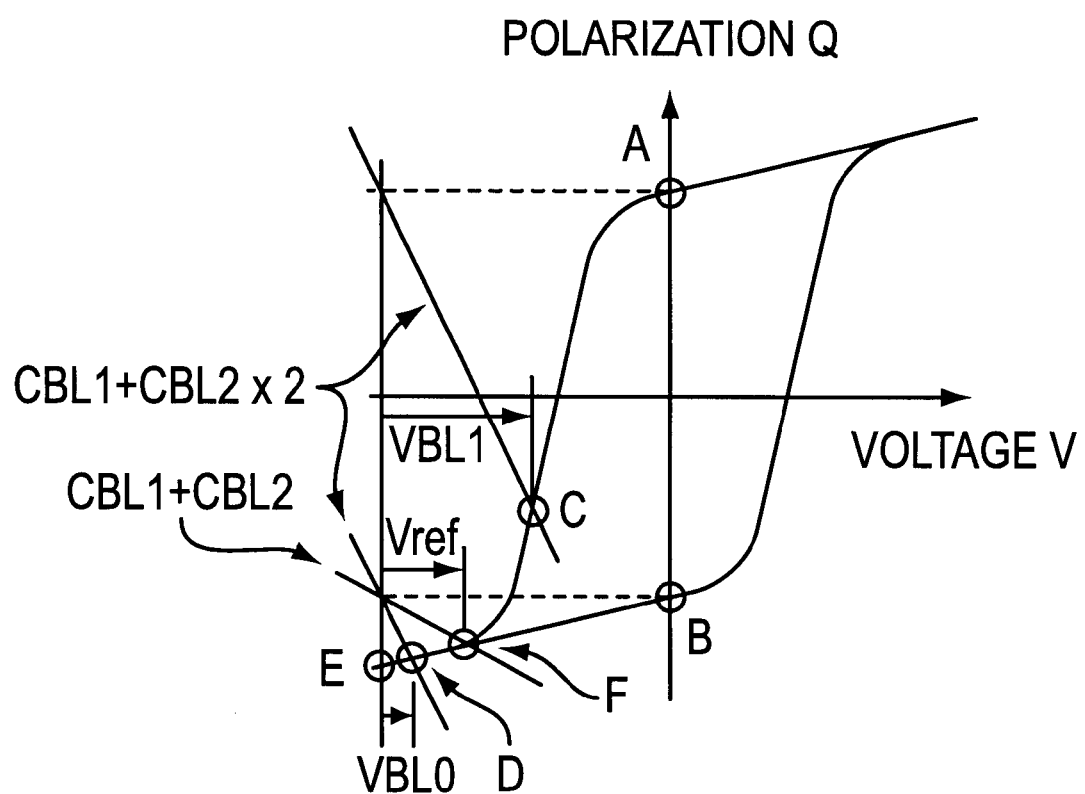
FIG. 16 is a graph for explaining the operation of the third embodiment.
Figure 17:
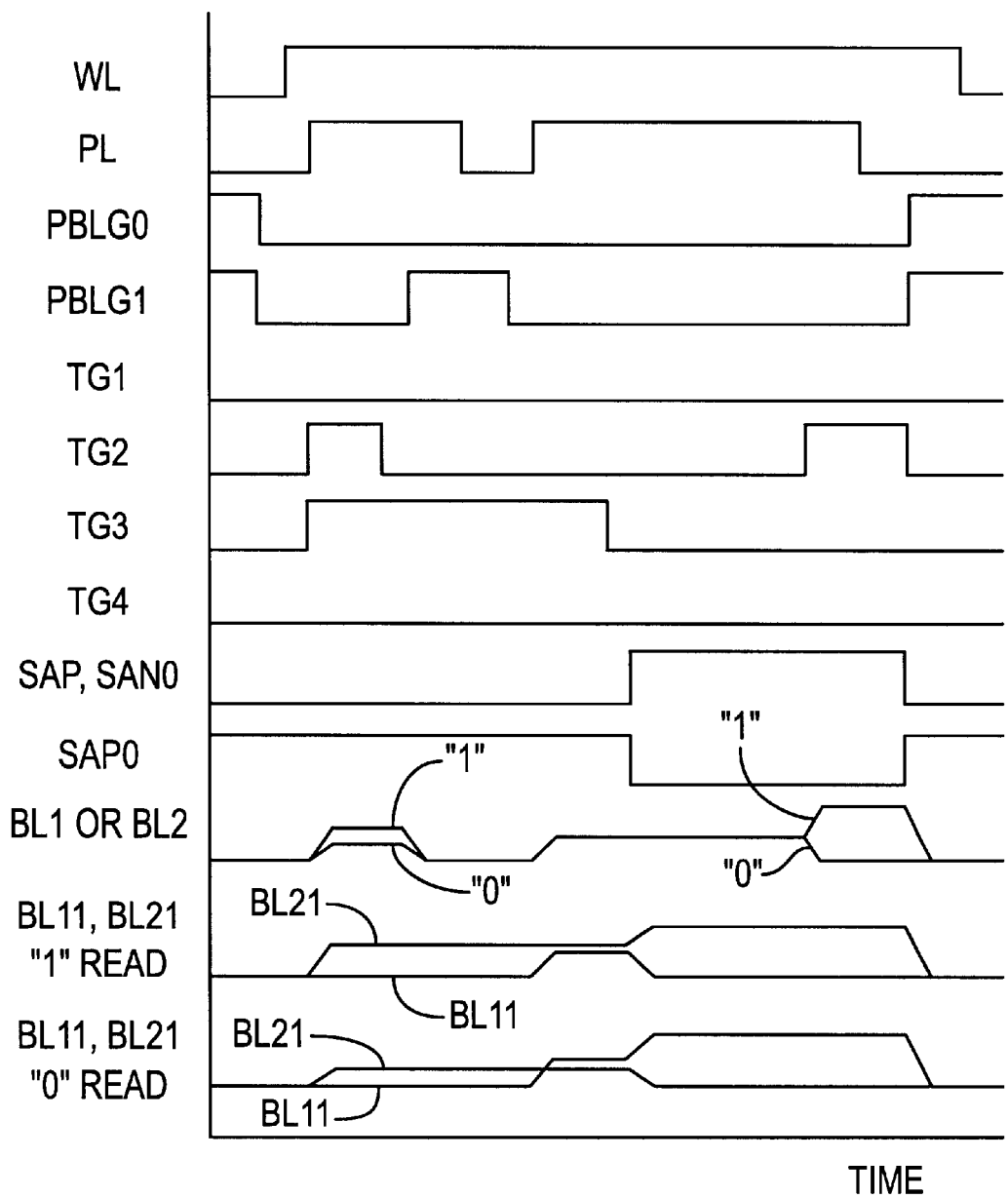
FIG. 17 is a timing chart showing the operation of the third embodiment.

The read operation of the circuit of FIG. 15 will be next explained with reference FIGS. 16 and 17. In FIG. 15, the present invention is implemented without the increase L in bit line length of FIG. 8 or providing the offst-adding circuit in FIG. 12. The circuit operation is substantially the same as that of the first embodiment. In a case in which memory cell MC1 is selected, however, signals TG2 and TG3 are made "H" simultaneously during a data read. Memory cell MC1 thus transitions from state A to state C when data is logic "1" and transitions from state B to state D when the data is logic "0". In addition, only signal TG3 is made "H" during a reference read. This is equivalent to lightening the load line and memory cell MC1 transitions from state B to state F. Voltage VBL1 or VBL0 corresponding to logic "1" or logic "0" is accordingly held in bit line BL21 and reference voltage Vref is held in bit line BL11, thereby enabling a correct read operation. As a result, in the present embodiment, the inexistence of imbalance in the capacitance of the two bit lines BL11 and BL21 eliminates any drop in sensitivity of sense amplifier SA1, and in addition, eliminates the need to provide a special circuit for adding an offset, thereby simplifying the construction. In this embodiment, moreover, signals TG1 and TG2 may be made "H" simultaneously during data reads, and only signal TG3 may be made "H" curing reference reads.

Figure 18:
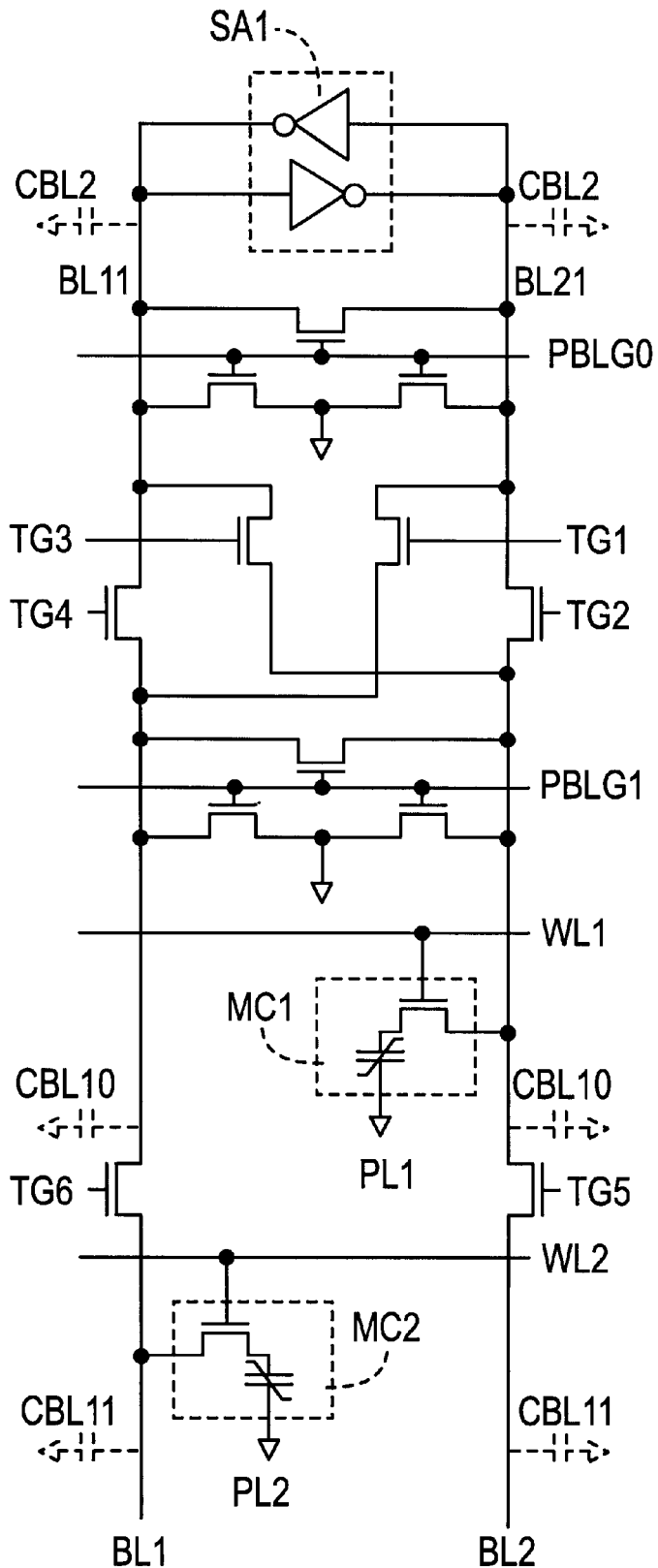
FIG. 18 is a circuit diagram of the ferroelectric memory device according to the fourth embodiment of the present invention.

FIG. 18 shows the fourth embodiment of the present invention. The constitutions of memory cell MC1, sense amplifier SA1, and the four MOS transistors controlled by signals TG1, TG2, TG3, and TG4 are equivalent to those of the first embodiment. In addition, MOS transistors controlled by signals TG5 and TG6 are provided between bit lines BL1 and BL2 in this embodiment so as to divide the memory cell array into two portions. In this way, a capacitance CBL10, which is a capacitance between CBL11 and CBL2 in the third embodiment, can be produced, thereby providing the optimum added capacitance.

Figure 19:
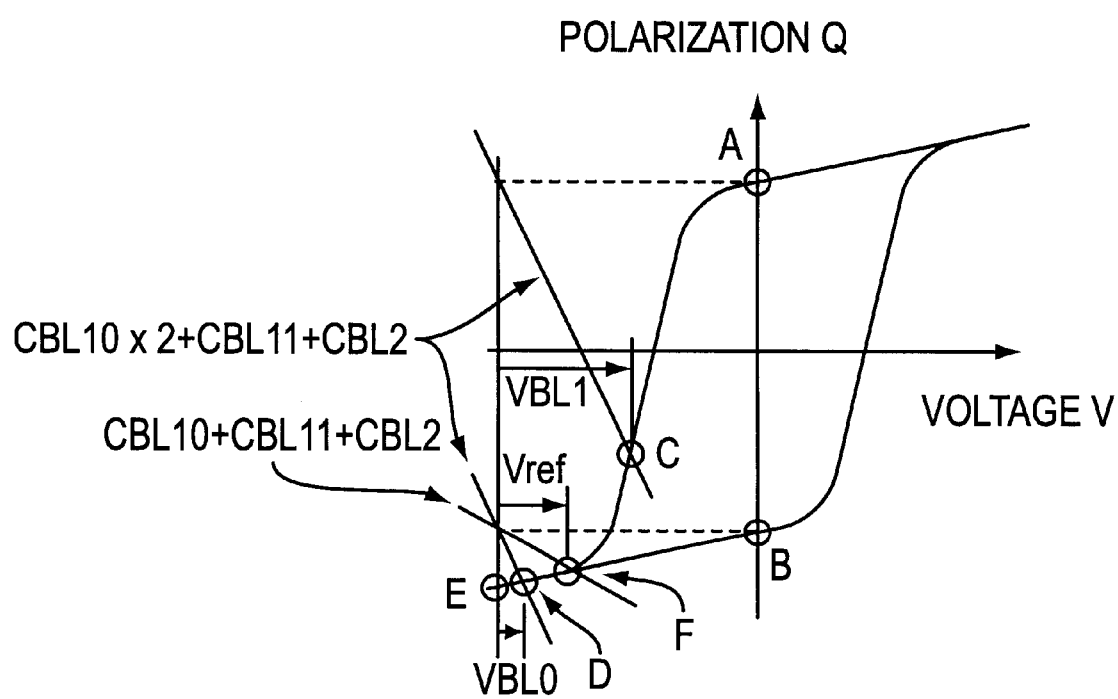
FIG. 19 is a graph for explaining the operation of the fourth embodiment.
Figure 20:
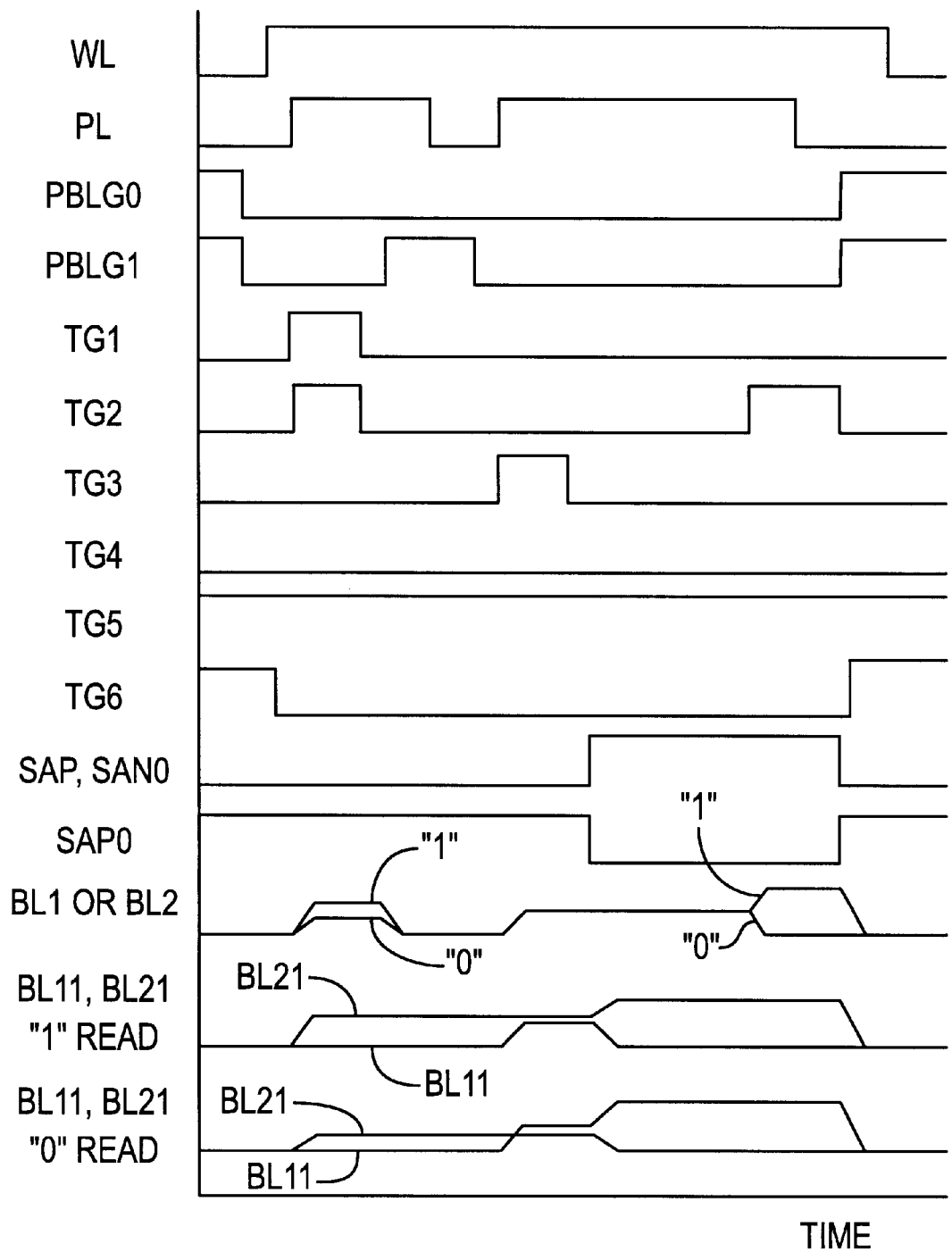
FIG. 20 is a timing chart showing the operation of the fourth embodiment.

The read operation of the circuit of FIG. 18 will be next explained with reference to FIGS. 19 and 20. The circuit operation is substantially the same as that of the third embodiment, signals TG1 and TG2 being made "H" simultaneously during a data read, and only signal TG3 being made "H" during a reference read. The present embodiment differs from the third embodiment in that signal TG5 is always "H" and signal TG6 is "L" when memory cell MC1 is selected. Voltage VBL1 or VBL0 corresponding to logic "1" or logic "0" is accordingly held in bit line BL21, and reference voltage Vref is held in bit line BL11, thereby enabling correct read operations. In this embodiment, either signal TG4 or TG6, or both, may be "H" during the first read. The load capacity can thus be changed in this embodiment, and this can be used to allow screening of memory cell MC1. When memory cell MC1 is selected, signals TG4 and TG6 are both made "L" during a normal read, but both are made "H" during screening, thereby narrowing the "1" read margin (VBL1-Vref). Since logic "1" cannot be read in cells in which the hysteresis characteristic has deteriorated, this arrangement enables detection of cells in which the hysteresis characteristic has deteriorated.

Figure 21:
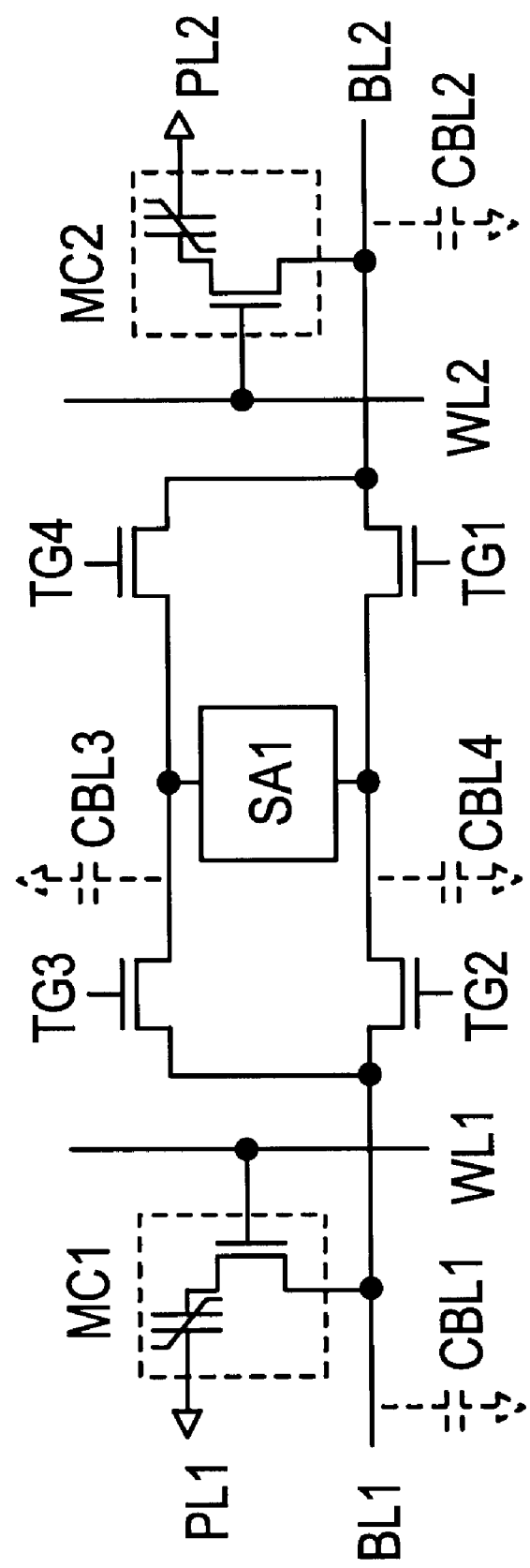
FIG. 21 is a circuit diagram of the ferroelectric memory device according to the fifth embodiment of the present invention.
Figure 22:
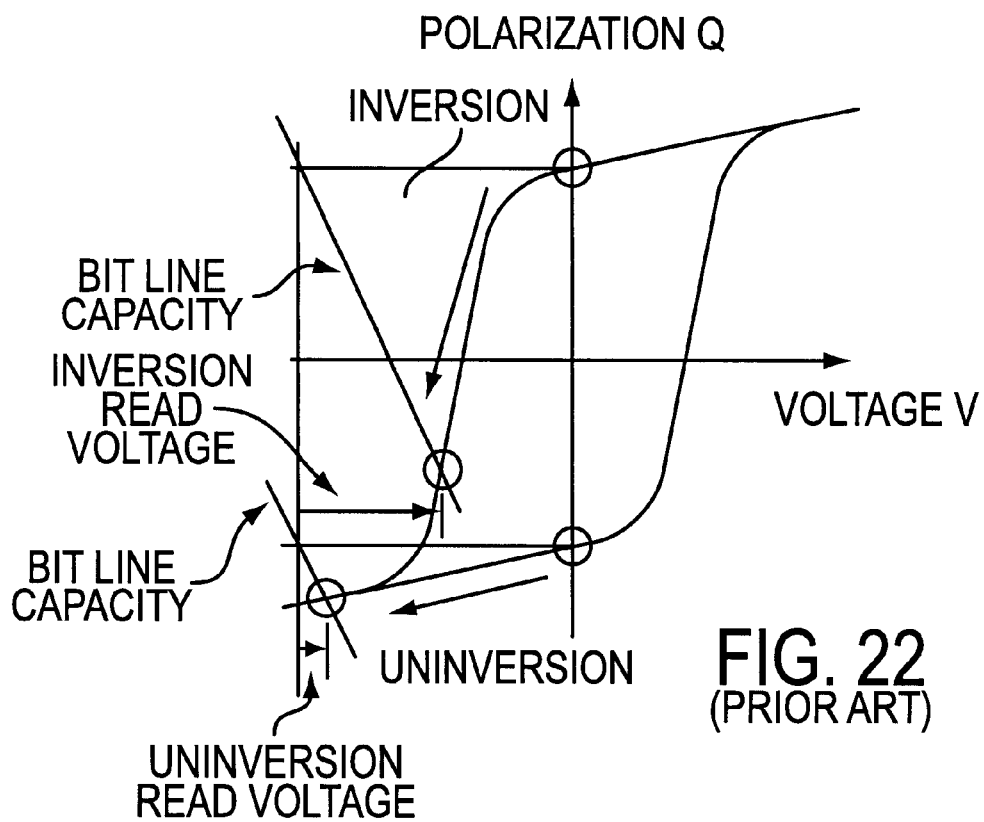
FIG. 22 is a graph showing the hysteresis characteristic of a ferroelectric.
Figure 23:
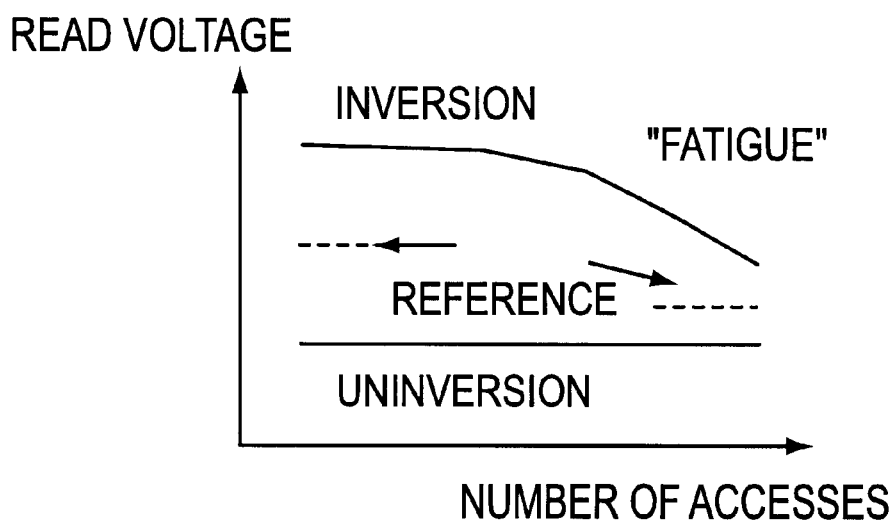
FIG. 23 is a graph showing the change in polarization charge of the ferroelectric with respect to the number of read-out operations.
Figure 24:
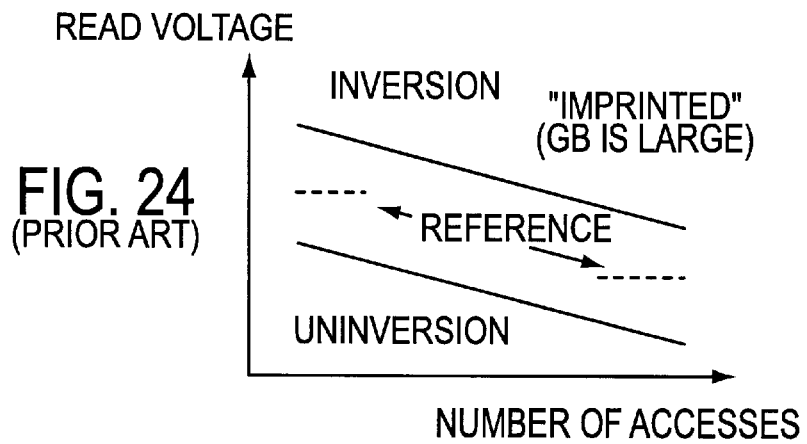
FIG. 24 is a graph showing the change in polarization charge of the ferroelectric with respect to the number of read-out operations.
Figure 25:
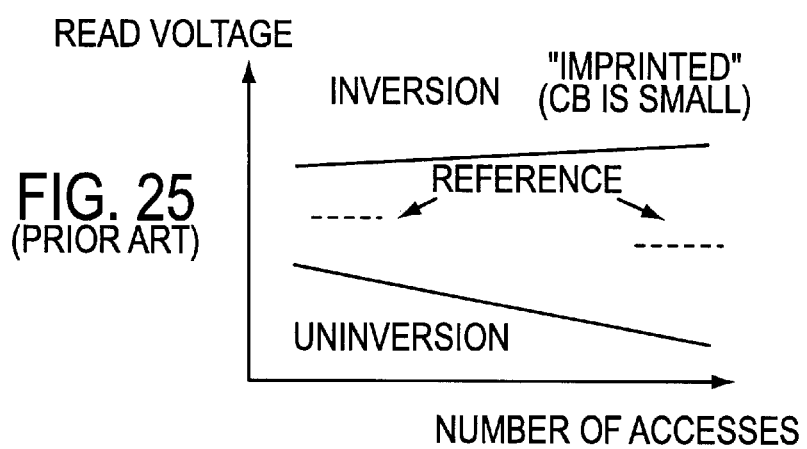
FIG. 25 is a graph showing the change in polarization charge of the ferroelectric with respect to the number of read-out operations.
Figure 26:
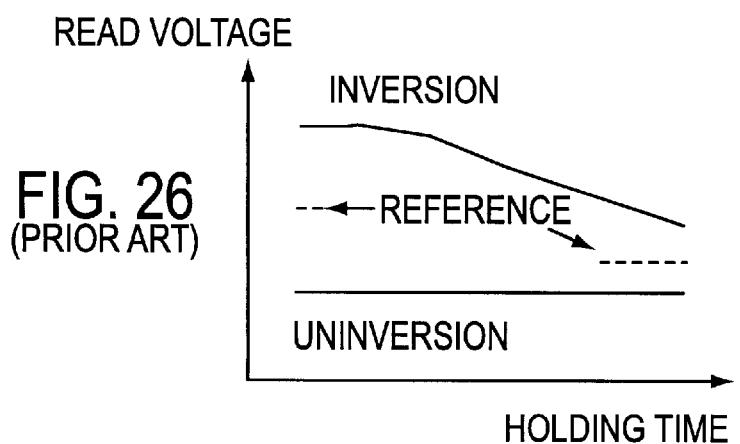
FIG. 26 is a graph showing the change in polarization charge of the ferroelectric with respect to retention time.

FIG. 21 shows the fifth embodiment of the present invention. The constitutions of memory cell MC1, sense amplifier SA1, and the four MOS transistors controlled by signals TG1, TG2, TG3, and TG4 are essentially the same as those in the first embodiment. The constitution of memory cell array MC1, however, is of an open bit line configuration, in contrast to the folded bit line configuration of the first, second, third, and fourth embodiments.

The read operation of the circuit of FIG. 21, is equivalent to that of the third embodiment. When memory cell MC1 is selected, therefore, signals TG2 and TG3 are simultaneously made "H" during a data read, and only signal TG3 is made "H" during a reference voltage read. In addition, signals TG1 and TG2 are simultaneously made "H" during a data read, and only signal TG3 may be made "H" during a reference read. This embodiment enables a smaller memory cell array. The open bit line configurations cannot be employed in DRAM due to the problem of noise, but in this embodiment, which is a two-read system, the problem of noise inherent in the open bit line configuration is eliminated because the two bit lines BL1 and BL2 need not be used simultaneously. The present embodiment therefore enables the use of the open bit line configuration of this invention, and a 2T2C cell of folded configuration of the prior art can therefore be made a folded 1T1C cell by means of the present invention, and by further making this an open bit line 1T1C cell, the present invention has the merit of greatly reducing the chip area.

While preferred embodiments of the present invention have been described using specific terms, such description is for illustrative purposes only, and it is to be understood that changes and variations may be made without departing from the spirit or scope of the following claims.

What is claimed is:

1. A ferroelectric memory device comprising:

a plurality of sets of bit lines;

a plurality of plate lines;

a plurality of word lines;

a plurality of memory cells, each having a single ferroelectric dielectric film capacitor and a single switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said bit lines;

a plurality of differential sense amplifiers connected to preseletected ones of said bit lines; and a means for generating a reference voltage using said single ferroelectric dielectric film capacitor from a corresponding one of said plurality of memory cells.

2. A ferroelectric memory device according to claim 1, further comprising a means for reading from said memory cell a second time after reading data from said memory cell a first time, and, in said differential sense amplifier, sensing data of the first read with respect to the data of the second read as a reference.

3. A ferroelectric memory device comprising:

a plurality of sets of bit lines;

a plurality of plate lines;

a plurality of word lines;

a plurality of memory cells, each having a single ferroelectric dielectric film capacitor and a single switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said bit lines;

a plurality of differential sense amplifiers connected to preseletected ones of said bit lines;

a reference voltage source generator which generates the reference voltage using said single ferroelectric dielectric film capacitor from a corresponding one of said plurality of memory cells;

a means for reading from said memory cell a second time after reading data from said memory cell a first time, and, in said differential sense amplifier, sensing data of the first read with respect to the data of the second read as a reference; and a means for writing logic "0" to said memory cells immediately before the second read.

4. A ferroelectric memory device comprising:

a plurality of sets of bit lines;

a plurality of plate lines;

a plurality of word lines;

a plurality of memory cells, each having a ferroelectric dielectric film capacitor and a switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said bit lines;

a plurality of differential sense amplifiers connected to preseletected ones of said bit lines;

a reference voltage source generator which generates a reference voltage using said single ferroelectric dielectric film capacitor from a corresponding one of said plurality of memory cells;

a means for reading from said memory cell a second time after reading data from said memory cell a first time, and, in said sense amplifier, sensing data of the first read with respect to the data of the second read as a reference;

a means for writing logic "0" that is read when the direction of polarization of the ferroelectric is in a non-inverse state immediately before the second read; and a means for precharging the bit line to a prescribed potential and not changing the potential of the plate line in the process of writing logic "0" before the second read.

5. A ferroelectric memory device comprising:

a plurality of sets of bit lines;

a plurality of plate lines;

a plurality of word lines;

a plurality of memory cells, each having a ferroelectric dielectric film capacitor and a switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said bit lines;

a plurality of differential sense amplifiers connected to preseletected ones of said bit lines;

a reference voltage source generator which generates the reference voltage using said single ferroelectric dielectric film capacitor from a corresponding one of said plurality of memory cells;

a means for reading from said memory cell a second time after reading data from said memory cell a first time, and, in said sense amplifier, sensing data of the first read with respect to the data of the second read as a reference;

a means for writing logic "0" that is read when the direction of polarization of the ferroelectric is in a non-inverse state immediately before the second read;

a means for sensing data of the first read and data of the second read, said means including switching transistors, for switching connections between two differential sense amplifier inputs, said means receiving said inputs from said bit lines; and a means for reading data of the first read at a first differential sense amplifier input, and reading data of the second read at a second differential sense amplifier input, holding the read data by the parasitic capacitance of said first and second differential sense amplifier inputs until said read data is sensed by said differential sense amplifier, and finally, providing an offset between data of the first read and data of the second read.

6. A ferroelectric memory device comprising:

a plurality of sets of bit lines;

a plurality of plate lines;

a plurality of word lines;

a plurality of memory cells, each having a ferroelectric dielectric film capacitor and a switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said bit lines;

a plurality of differential sense amplifiers connected to preseletected ones of said bit lines;

a reference voltage source generator;

a means for reading from said memory cell a second time after reading data from said memory cell a first time, and, in said sense amplifier, sensing data of the first read with respect to the data of the second read as a reference;

a means for writing logic "0" that is read when the direction of polarization of the ferroelectric is in a non-inverse state immediately before the second read;

a means for sensing data of the first read and data of the second read, said means including switching transistors, for switching connections between two differential sense amplifier inputs, said means receiving said inputs from said bit lines; and a means for reading data of the first read at a first differential sense amplifier input, and reading data of the second read at a second differential sense amplifier input, holding the read data by the parasitic capacitance of said first and second differential sense amplifier inputs until said read data is sensed by said differential sense amplifier, and finally, providing an offset between data of the first read and data of the second read, wherein the bit line connected to said first differential sense amplifier input of said differential sense amplifier is longer than the bit line connected to said second differential sense amplifier input, thereby providing a first means for said offset.

7. A ferroelectric memory device comprising:

a plurality of sets of bit lines;

a plurality of plate lines;

a plurality of word lines;

a plurality of memory cells, each having a ferroelectric dielectric film capacitor and a switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said bit lines;

a plurality of differential sense amplifiers connected to preseletected ones of said bit lines;

a reference voltage source generator;

a means for reading from said memory cell a second time after reading data from said memory cell a first time, and, in said sense amplifier, sensing data of the first read with respect to the data of the second read as a reference;

a means for writing logic "0" that is read when the direction of polarization of the ferroelectric is in a non-inverse state immediately before the second read;

a means for sensing data of the first read and data of the second read, said means including switching transistors, for switching connections between two differential sense amplifier inputs, said means receiving said inputs from said bit lines;

a means for reading data of the first read at a first differential sense amplifier input, and reading data of the second read at a second differential sense amplifier input, holding the read data by the parasitic capacitance of said first and second differential sense amplifier inputs until said read data is sensed by said differential sense amplifier, and finally, providing an offset between data of the first read and data of the second read; and an offset-adding circuit having first and second switching transistors, which provide a second means for said offset, said offset-adding circuit comprising said first switching transistor having a drain connected to said first differential sense amplifier input, a gate connected to a second control signal line, and a source connected to a drain of said second switching transistor, and said second switching transistor having a gate connected to said second differential sense amplifier input and a source connected to a ground potential; wherein said first switching transistor is rendered conductive by said second control signal during reading.

8. A ferroelectric memory device comprising:

a plurality of sets of bit lines;

a plurality of plate lines;

a plurality of word lines;

a plurality of memory cells, each having a ferroelectric dielectric film capacitor and a switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said bit lines;

a plurality of differential sense amplifiers connected to preseletected ones of said bit lines;

a reference voltage source generator;

a means for reading from said memory cell a second time after reading data from said memory cell a first time, and, in said sense amplifier, sensing data of the first read with respect to the data of the second read as a reference; a means for writing logic "0" that is read when the direction of polarization of the ferroelectric is in a non-inverse state immediately before the second read;

a means for sensing data of the first read and data of the second read, said means including switching transistors, for switching connections between two differential sense amplifier inputs, said means receiving said inputs from said bit lines;

a means for reading data of the first read at a first differential sense amplifier input, and reading data of the second read at a second differential sense amplifier input, holding the read data by the parasitic capacitance of said first and second differential sense amplifier inputs until said read data is sensed by said differential sense amplifier, and finally, providing an offset between data of the first read and data of the second read; and an offset-adding circuit including first, second, third and fourth switching transistors, which provide a third means for said offset; said offset-adding circuit comprising said first switching transistor having a drain connected to said first differential sense amplifier input, a gate connected to a second control signal line, and a source connected to a drain of said second switching transistor; said second switching transistor having a gate connected to said second differential sense amplifier input and a source connected to a ground potential; said third switching transistor having a drain connected to said second differential sense amplifier input, a gate connected to a first control signal line, and a source connected to a drain of said fourth switching transistor; and said fourth switching transistor having a gate connected to said first differential sense amplifier input and a source connected to a ground potential; wherein said first or said third switching transistor is rendered conductive by said first or said second control signal line during reading.

9. A ferroelectric memory device comprising:

a plurality of sets of bit lines;

a plurality of plate lines;

a plurality of word lines;

a plurality of memory cells, each having a ferroelectric dielectric film capacitor and a switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said bit lines;

a plurality of differential sense amplifiers connected to preselected ones of said bit lines;

a reference voltage source generator;

a means for reading from said memory cell a second time after reading data from said memory cell a first time, and, in said sense amplifier, sensing data of the first read with respect to the data of the second read as a reference;

a means for writing logic "0" that is read when the direction of polarization of the ferroelectric is in a non-inverse state immediately before the second read;

a means for sensing data of the first read and data of the second read, said means including switching transistors, for switching connections between two differential sense amplifier inputs, said means receiving said inputs from said bit lines;

a means for reading data of the first read at a first differential sense amplifier input, and reading data of the second read at a second differential sense amplifier input, holding the read data by the parasitic capacitance of said first and second differential sense amplifier inputs until said read data is sensed by said differential sense amplifier, and finally, providing an offset between data of the first read and data of the second read; and a means of providing said offset, having a means for reading data of the first read to both said first differential sense amplifier input and said second differential sense amplifier input, and for reading the reference read of the second read to either said first differential sense amplifier input or said second differential sense amplifier input.

10. The ferroelectric memory device according to claim 9, further comprising a means for dividing the bit lines connected to said first and second differential sense amplifier inputs, thereby varying the value of the respective bit line capacitances.

11. The ferroelectric memory device according to claim 1, wherein said switching transistor is a MOS transistor.

12. The ferroelectric memory device according to claim 11, wherein the source of said MOS transistor is connected to said second electrode of said capacitor, the gate of said MOS transistor is connected to a preselected one of said word lines, and the drain of said MOS transistor is connected to a preselected one of said bit lines.

13. The ferroelectric memory device according to claim 5, wherein the data of the second read provides the reference voltage.

14. The ferroelectric memory device according to claim 5, wherein said memory cell provides the data of the first read and the data of the second read.

15. The ferroelectric memory device according to claim 5, wherein said differential amplifiers contain said means for sensing data of the first read and data of the second read.

16. The ferroelectric memory device according to claim 5, wherein said switching transistors are MOS transistors.

17. The ferroelectric memory device according to claim 5, wherein said means for sensing data of the first read and data of the second read are situated between the two inputs belonging to said differential sense amplifier and bit lines connected to said memory cell.

18. The ferroelectric memory device according to claim 5, wherein an offset is provided between data of the first read and data of the second read even when data of the first read is logic "0".

19. The ferroelectric memory device according to claim 7, wherein said switching transistors are MOS transistors.

20. The ferroelectric memory device according to claim 8, wherein said switching transistors are MOS transistors.

21. The ferroelectric memory device according to claim 3, wherein said switching transistor is a MOS transistor.

22. The ferroelectric memory device according to claim 21, wherein the source of said MOS transistor is connected to said second electrode of said capacitor, the gate of said MOS transistor is connected to a preselected one of said word lines, and the drain of said MOS transistor is connected to a preselected one of said bit lines.

23. A ferroelectric memory device comprising:

a plurality of sets of bit lines;

a plurality of plate lines;

a plurality of word lines;

a plurality of memory cells, each having a ferroelectric dielectric film capacitor and a switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said bit lines, and wherein said single ferroelectric dielectric film capacitor from a corresponding one of said plurality of memory cells provides a reference voltage;

a plurality of differential sense amplifiers connected to preseletected ones of said bit lines; and an offset-adding circuit having first and second switching transistors, which provide a second means for said offset, said offset-adding circuit comprising said first switching transistor having a drain connected to said first differential sense amplifier input, a gate connected to a second control signal line, and a source connected to a drain of said second switching transistor, and said second switching transistor having a gate connected to said second differential sense amplifier input and a source connected to a ground potential; wherein said first switching transistor is rendered conductive by said second control signal during reading.

24. The ferroelectric memory device according to claim 23, wherein said switching transistors are MOS transistors.

25. A ferroelectric memory device comprising:

a plurality of sets of bit lines;

a plurality of plate lines;

a plurality of word lines;

a plurality of memory cells, each having a ferroelectric dielectric film capacitor and a switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said bit lines;

a plurality of differential sense amplifiers connected to preseletected ones of said bit lines; and an offset-adding circuit including first, second, third and fourth switching transistors, which provide a third means for said offset; said offset-adding circuit comprising said first switching transistor having a drain connected to said first differential sense amplifier input, a gate connected to a second control signal line, and a source connected to a drain of said second switching transistor; said second switching transistor having a gate connected to said second differential sense amplifier input and a source connected to a ground potential; said third switching transistor having a drain connected to said second differential sense amplifier input, a gate connected to a first control signal line, and a source connected to a drain of said fourth switching transistor; and said fourth switching transistor having a gate connected to said first differential sense amplifier input and a source connected to a ground potential; wherein said first or said third switching transistor is rendered conductive by said first or said second control signal line during reading.

26. The ferroelectric memory device according to claim 25, wherein said switching transistors are MOS transistors.

27. A ferroelectric memory device comprising:

a plurality of sets of bit lines;

a plurality of plate lines;

a plurality of word lines;

a plurality of memory cells, each having a single ferroelectric dielectric film capacitor and a single switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said lines;

a plurality of differential sense amplifiers connected to preseletected ones of said bit lines; and a means for generating a reference voltage using said single ferroelectric dielectric film capacitor from a corresponding one of said plurality of memory cells to compensate for a deteriorating ferroelectric film characteristic.

28. A method of reading information from a ferroelectric memory device, having a plurality of sets of bit lines, a plurality of plate lines, a plurality of word lines, a plurality of memory cells, each having a ferroelectric dielectric film capacitor and a switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said bit lines, and a plurality of differential sense amplifiers connected to preseletected ones of said bit lines, comprising the steps of:

(a) precharging selected bit lines to a ground potential;

(b) selecting and reading data from predetermined memory cells onto said selected bit lines and sending said read data to a first input of a selected one of said differential sense amplifiers;

(c) precharging selected bit lines to a ground potential and writing a "0" to selected memory cells, thereby providing a reference voltage which is sent to a second input of said selected one of said differential sense amplifiers;

(d) activating a corresponding one of said selected differential sense amplifiers having said first and second inputs, and (e) sensing the data received at said first and second inputs, and determining a difference between the voltage at said first input and the reference voltage at said second input, thereby sensing the value of the data received at said first input.

29. The method of reading information from a ferroelectric memory device according to claim 28, wherein an offset is established between the data received at said first and second inputs of step (e).

30. A method of writing information to a ferroelectric memory device, having a plurality of sets of bit lines, a plurality of plate lines, a plurality of word lines, a plurality of memory cells, each having a ferroelectric dielectric film capacitor and a switching transistor, wherein a first electrode of said capacitor is connected to a preselected one of said plate lines, a second electrode of said capacitor is connected to a first terminal of said switching transistor, a second terminal of said switching transistor is connected to a preselected one of said word lines, and a third terminal of said switching transistor is connected to a preselected one of said bit lines, and a plurality of differential sense amplifiers connected to preseletected ones of said bit lines, comprising the steps of:

(a) providing a predetermined bias to selected ones of said plate lines;

(b) deactivating a corresponding one of said selected differential sense amplifiers;

(c) discharging selected bit lines; and (d) providing a predetermined biasing to selected ones of said word lines to complete the writing operation.

* * * * *